US007239006B2

(12) United States Patent
Coolbaugh et al.

(10) Patent No.: US 7,239,006 B2
(45) Date of Patent: Jul. 3, 2007

(54) RESISTOR TUNING

(75) Inventors: Douglas D. Coolbaugh, Essex Junction, VT (US); Ebenezer E. Eshun, Essex Junction, VT (US); Robert M. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/709,115

(22) Filed: Apr. 14, 2004

(65) Prior Publication Data

US 2005/0230785 A1 Oct. 20, 2005

(51) Int. Cl.
*H01L 29/00* (2006.01)

(52) U.S. Cl. ...................... 257/537; 257/530; 257/536; 257/538

(58) Field of Classification Search ........ 257/536-538, 257/541, 530
See application file for complete search history.

(56) References Cited

U.S. PATENT DOCUMENTS 4,606,781 A 8/1986 Vyne
5,083,183 A * 1/1992 Kobayashi .................. 257/537
5,466,484 A 11/1995 Spraggins et al.
5,917,244 A * 6/1999 Lee et al. ................... 257/762
6,426,268 B1 7/2002 Huppert et al.
6,455,392 B2 9/2002 Maimon et al.
6,481,831 B1 11/2002 Davis et al.
6,500,724 B1 12/2002 Zurcher et al.
6,911,360 B2 * 6/2005 Li et al. ..................... 438/238

* cited by examiner

*Primary Examiner*—Shouxiang Hu
(74) *Attorney, Agent, or Firm*—Schmeiser, Olsen & Watts; Anthony J. Canale

(57) ABSTRACT

A structure for resistors and the method for tuning the same. The resistor comprises an electrically conducting region coupled to a liner region. Both the electrically conducting region and the liner region are electrically coupled to first and second contact regions. A voltage difference is applied between the first and second contact regions. As a result, a current flows between the first and second contact regions in the electrically conducting region. The voltage difference and the materials of the electrically conducting region and the liner region are such that electromigration occurs only in the electrically conducting region. As a result, a void region within the electrically conducting region expands in the direction of the flow of the charged particles constituting the current. Because the resistor loses a conducting portion of the electrically conducting region to the void region, the resistance of the resistor is increased (i.e., tuned).

2 Claims, 6 Drawing Sheets

FIG. 2Bii

FIG. 5A1
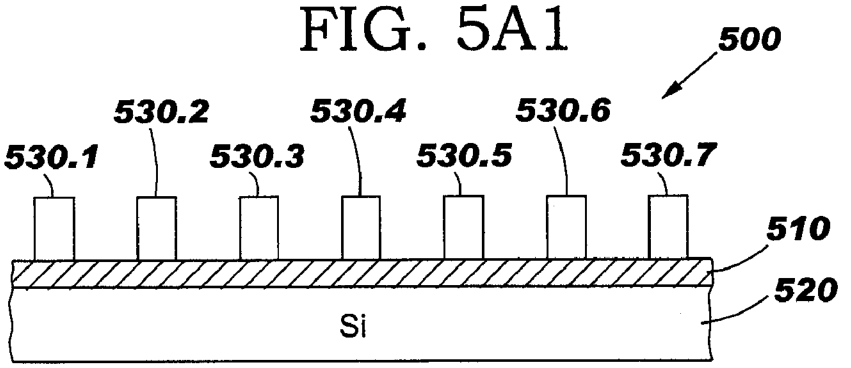
FIG. 5A2
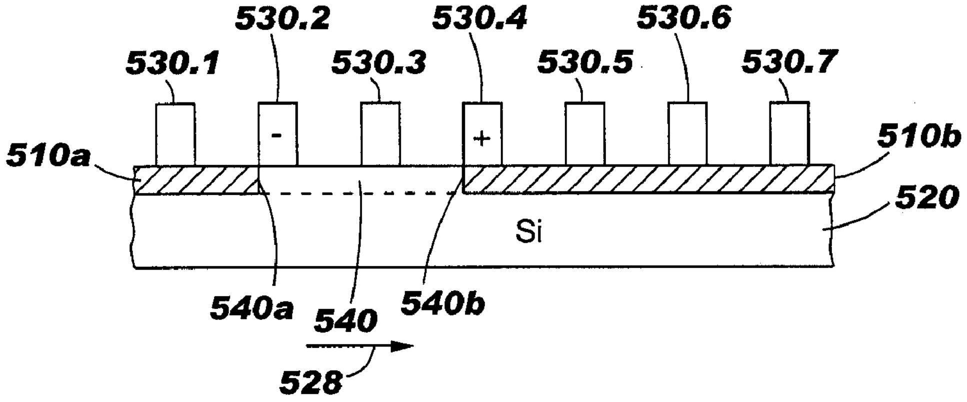
FIG. 5B1
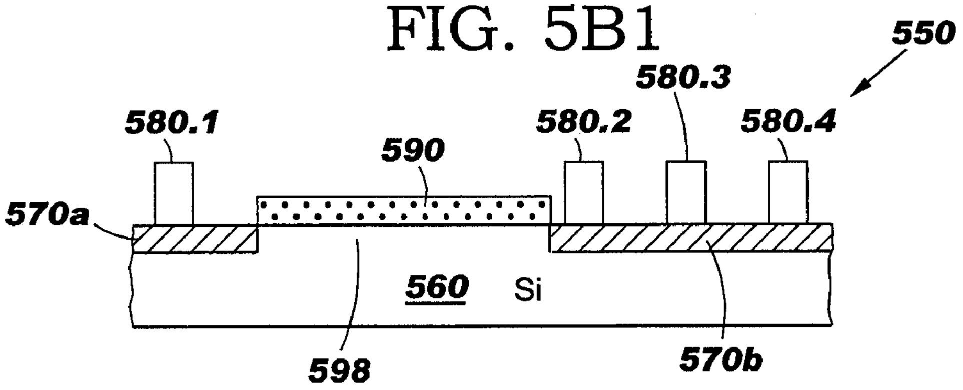
FIG. 5B2
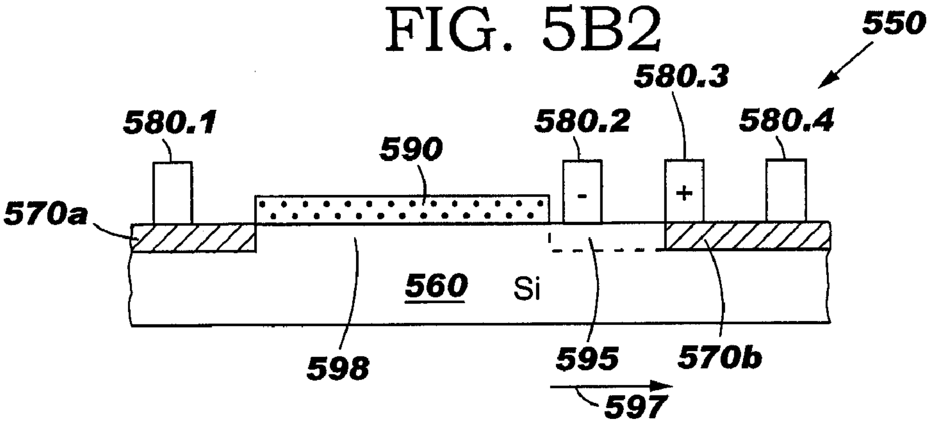

RESISTOR TUNING

BACKGROUND OF INVENTION

1. Technical Field

The present invention relates to methods for tuning (i.e., trimming) resistors of a chip, and more particularly, to a method for tuning resistors of a chip that can be used both before and after chip packaging.

2. Related Art

Conventional manufacturing controls on processes for forming passive devices, such as resistors in CMOS (Complementary Metal Oxide Silicon) chips, fall short of current circuit design requirements. Current industry standard I/O (Input/Output) specifications are exceeding what can be achieved in current manufacturing processes. Within analog and RF (radio frequency) semiconductors, the need for tuning the electrical resistance values of the resistors on an integrated circuit to a specific nominal value is growing to meet complex design specification requirements. Manufacturing excess chips and then sorting for required parameters is one solution, but this is a costly and not consistent with manufacturing techniques. Laser ablation is used to trim in the manufacture of some precision passive devices, but this process is inconsistent with the CMOS/BiCMOS or Analog process flow as a measurement and feedback loop is required as well as individual laser trimming of a multitude of devices on a single chip. A third known solution is to design active controls into the circuitry to compensate for manufacturing variability, but this takes up space, increases complexity, and can lead to trade-offs in performance.

Therefore, there is a need for a novel resistance structure that can be tuned to a specification. Also, there is a need for a method for tuning the novel resistance structure.

SUMMARY OF INVENTION

The present invention provides a resistor structure, comprising (a) an electrically conducting region; (b) a liner region coupled to the electrically conducting region; and (c) first and second contact regions electrically coupled to the electrically conducting region and the liner region, wherein in response to a current flowing in the electrically conducting region and from the first contact region to the second contact region, a void region in the electrically conducting region expands due to electromigration so as to increase the resistance of the resistor structure between the first and second contact regions.

The present invention also provides a method for tuning a resistor structure, the method comprising the steps of (a) providing (i) an electrically conducting region, (ii) a liner region coupled to the electrically conducting region, and (iii) first and second contact regions electrically coupled to the electrically conducting region and a liner region; and (b) flowing a current in the electrically conducting region and from the first contact region to the second contact region such that a void region in the electrically conducting region expands due to electromigration so as to increase the resistance of the resistor structure between the first and second contact regions.

The present invention also provides a providing in the resistor structure (i) a semiconductor region, (ii) an electrically conducting layer formed on the semiconductor region, (iii) a plurality of contact regions electrically coupled to the electrically conducting layer; (b) selecting first and second contact regions of the plurality of contact regions such that if intervals of the electrically conducting layer between the first and second contact regions are replaced by a void region due to electromigration, the resistance of the resistor structure between third and fourth contact regions of the plurality of contact regions is within a predetermined tolerance of a pre-specified target resistance value; and (c) applying a voltage difference between the first and second contact regions until the intervals of the electrically conducting layer between the first and second contact regions are replaced by the void region due to electromigration.

BRIEF DESCRIPTION OF DRAWINGS

FIGS. 5A1 and 5A2 illustrate cross-sectional views of yet another resistor structure before and after tuning, respectively, in accordance with embodiments of the present invention.

FIGS. 5B1 and 5B2 illustrate cross-sectional views of yet another resistor structure before and after tuning, respectively, in accordance with embodiments of the present invention.

DETAILED DESCRIPTION

Figure 1A:
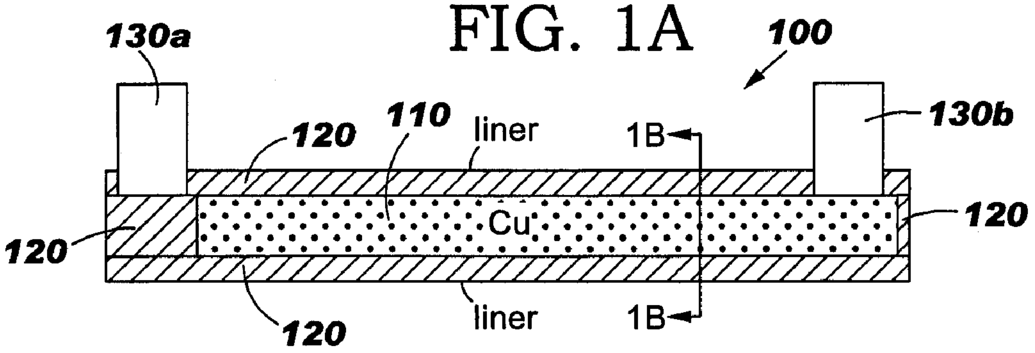
FIG. 1A illustrates a cross-sectional view of a resistor structure, in accordance with embodiments of the present invention.

FIG. 1A illustrates a cross-sectional view of a resistor structure 100, in accordance with embodiments of the present invention. Illustratively, the resistor structure 100 comprises a copper wire 110 surrounded by an electrically conducting liner layer 120. The two ends (hereafter, referred to as the first and second ends) of the copper wire 110 are electrically coupled to the vias 130*a* and 130*b*, respectively. In one embodiment, the first end of the copper wire 110 is electrically coupled to the via 130*a* through the electrically conducting liner layer 120, and the second end of the copper wire 110 is in direct physical contact with the via 130*b*.

Figure 1B:
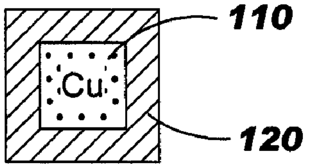
FIG. 1B illustrates a view along a line 1B—1B of the resistor structure of FIG. 1A.

FIG. 1B illustrates a view along line 1B—1B of the resistor structure 100 of FIG. 1A, in accordance with embodiments of the present invention. FIG. 1B shows that the copper wire 110 is surrounded by the liner layer 120. In an alternative embodiment, the resistor structure 100 could have the conducting liner layer 120 incorporated only on the side walls and below the wire 110 and a non-conducting passivation layer formed on the top surface on the wire 110. This would be consistent with standard BEOL damascene Cu processing techniques that do not use electrolysis plating to form a conducting liner atop surfaces of exposed wires 110.

Figure 1C:
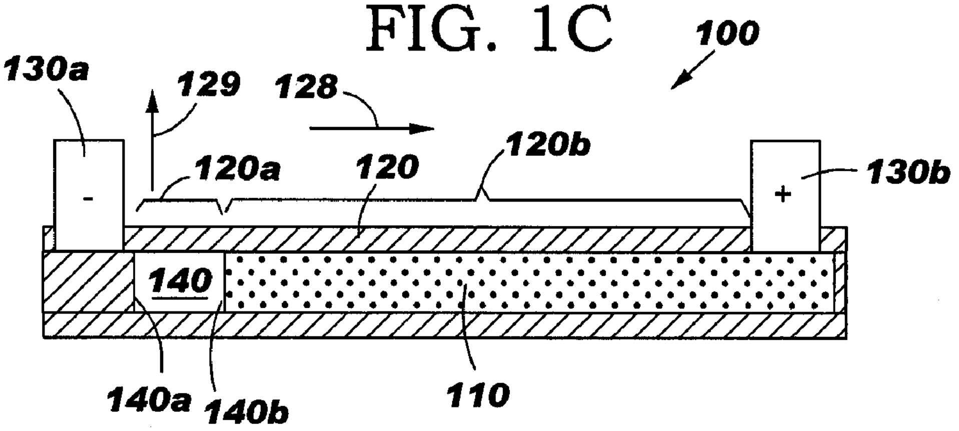
FIG. 1C illustrates the resistor structure of FIG. 1A after tuning, in accordance with embodiments of the present invention.

FIG. 1C illustrates the resistor structure 100 of FIG. 1A after tuning, in accordance with embodiments of the present invention. In one embodiment, a voltage difference is applied between the vias 130*a* and 130*b* with the via 130*b* having a higher voltage than the via 130*a*. As a result, a current flow through the resistor structure 100 from the via 130*b* to the via 130*a*. In essence, the current comprises electrons flowing from the via 130*a* to the via 130*b*. The magnitude of the current is calculated such that electromigration occurs in the copper wire 110, but not in the liner layer 120. Electromigration is a phenomenon in which atoms of a conductor, under the effect of a current flowing in the conductor, migrate in the conductor in the direction of the flow of the charged particles of the current. Here, the charged particles are electrons flowing from the via 130*a* to the via 130*b*. As a result, copper atoms of the copper wire 110 migrate in the direction of the flow of the electrons in the copper wire 110 (i.e., direction 128). As a result of electromigration occurring in the copper wire 110, a void region (empty space) 140 forms and grows in the copper wire 110, from the contact surface 140*a* between the liner layer 120 and the copper wire 110, and in the direction of the flow of the electrons (i.e., the direction 128). Because the resistor structure 100 loses a good conducting portion to the void region 140, the electrical resistance of the resistor structure 100 between the vias 130*a* and 130*b* is increased.

Figure 1D:
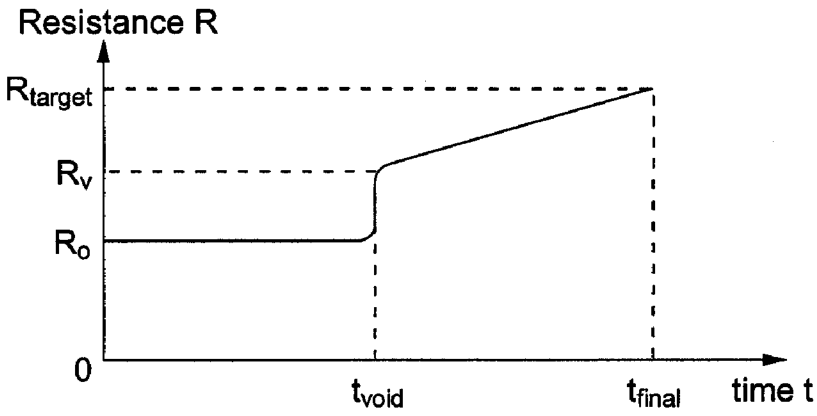
FIG. 1D illustrates the relationship between the resistance and tuning time of the resistor structure of FIG. 1A, in accordance with embodiments of the present invention.

FIG. 1D illustrates the relationship between the electrical resistance R of the resistor structure 100 of FIG. 1A between the vias 130*a* and 130*b* and tuning time t during which a flow of electrons sufficiently strong to cause electromigration to occur in the copper wire 110, but not in the liner layer 120, flows through the resistor structure 100, in accordance with embodiments of the present invention. With reference to FIGS. 1A, 1B, 1C, and 1D, initially (i.e., t=0), $R=R_0$, which is an initial resistance value. Then, for t>0, the void region 140 (FIG. 1C) starts growing from the contact surface 140*a*, but has not spread vertically across the width of the wire 110 (i.e., in and opposite to the direction 129 of FIG. 1C). As a result, R is almost unchanged. At time $t=t_{void}$, the void region 140 extends across the width of the wire 110, and as a result, R jumps to value $R_v$, which is determined by the resistance of the liner section 120*a* (FIG. 1C) of the resistor structure 100 (the resistance of the remaining section 120*b* of the resistor structure 100 is small and negligible compared with the resistance of the liner section 120*a*). After that (i.e., $t>t_{void}$), R increases at a constant rate void which depends on the speed of growth of the void region 140 in the direction of the flow of electrons (i.e., the direction 128). Finally, at $t=t_f$, the tuning of the resistor structure 100 is complete and the applied voltage is removed because $R=R_{target}$, which is the target value of R. At this time, the void region 140 grows to a surface 140*b* between the void region 140 and the copper wire 110.

Figure 2A:
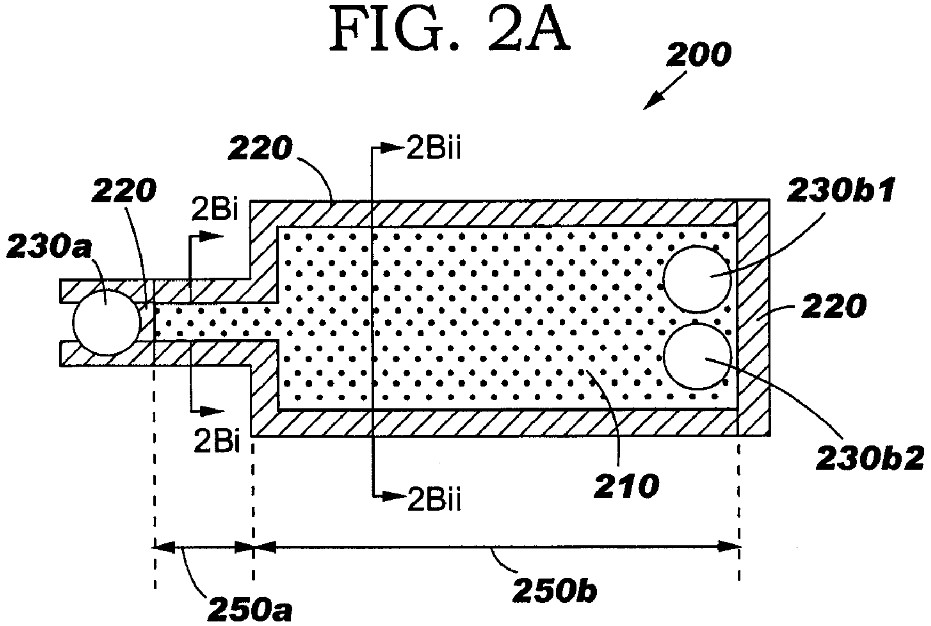
FIG. 2A illustrates a top view of another resistor structure, in accordance with embodiments of the present invention.

FIG. 2A illustrates a top view of a resistor structure 200, in accordance with embodiments of the present invention. Illustratively, the resistor structure 200 comprises a copper wire 210 surrounded by an electrically conducting liner layer 220. One end (hereafter, referred to as the first end) of the copper wire 210 is electrically coupled to the via 230*a* and the other end (hereafter, referred to as the second end) of the copper wire 210 is electrically coupled to, illustratively, the vias 230*b*1 and 230*b*2. In one embodiment, the first end of the copper wire 210 is electrically coupled to the via 230*a* through the electrically conducting liner layer 220, and the second end of the copper wire 210 is in direct physical contact with the vias 230*b*1 and 230*b*2. The resistor structure 200 comprises two sections 250*a* and 250*b*. The section 250*a* has the same structure as the section 250*b*, but has a smaller width.

Figure 2B:
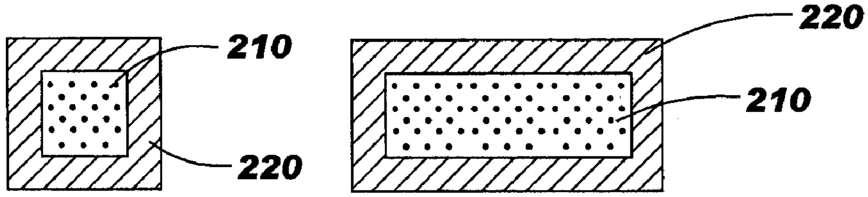
FIGS. 2Bi and 2Bii illustrate two views along lines 2Bi—2Bi and 2Bii—2Bii, respectively, of the resistor structure of FIG. 2A.

FIGS. 2Bi and 2Bii illustrate two views along lines 2Bi—2Bi and 2Bii—2Bii, respectively, of the resistor structure of FIG. 2A. As shown in FIGS. 2Bi and 2Bii, in both the sections 250*a* and 250*b* of the resistor structure 200, the copper wire 210 is at the center of the resistor structure 200 surrounded by the electrically conducting liner layer 220. The liner layer 220 comprises a material less electrically conducting than the material of the wire 210 (i.e., copper). Similar to the earlier structure 100, this resistor structure 200 could also have the conducting liner layer 220 integrated only on the side walls and below the wire 210 and a non-conducting passivation layer formed on the top surface on the wire 210.

Figure 2C:
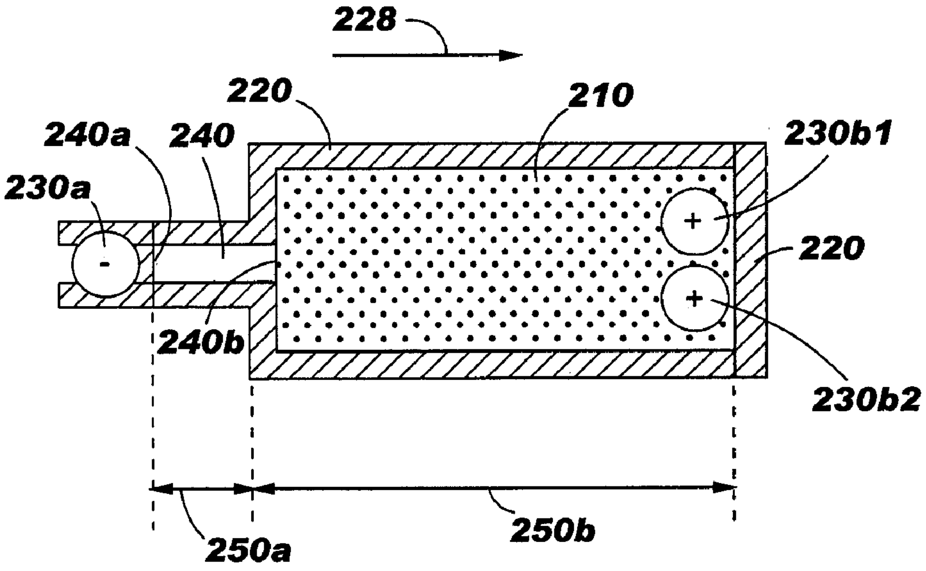
FIG. 2C illustrates the resistor structure of FIG. 2A after tuning, in accordance with embodiments of the present invention.

FIG. 2C illustrates the resistor structure 200 of FIG. 2A after tuning, in accordance with embodiments of the present invention. In one embodiment, a voltage difference is applied between the first and second ends of the copper wire 210. More specifically, the higher voltage potential of the voltage difference is applied to both the vias 230*b*1 and 230*b*2 and the lower voltage potential of the voltage difference is applied to the via 230*a*. As a result, a current flow through the resistor structure 200 from the via 230*a* to the vias 230*b*1 and 230*b*2 (i.e., the direction 228). The magnitude of the current is calculated such that electromigration occurs for the copper wire 210 in the section 250*a*, but not in the section 250*b*. This is because electromigration occurs only where the current density exceeds a minimum value. Therefore, if the magnitude of the current flowing through the resistor structure 200 is such that the current density in the section 250*a* exceeds the minimum value and current density in the section 250*b* does not exceed the minimum value, then electromigration occurs for the copper wire 210 in the section 250*a*, but not in the section 250*b*.

As a result of electromigration occurring in only the section 250*a* of the copper wire 210, a void region (empty space) 240 forms and grows in the copper wire 210 from the contact surface 240*a* between the liner layer 220 and the copper wire 210, and in the direction of the flow of the electrons constituting the current (i.e., the direction 228). The void region 240 grows but stops at the interface surface 240*b* between the section 250*a* and section 250*b*. Because the resistor structure 200 loses a good conducting portion to the void region 240, the resistance of the resistor structure 200 between the first end (vias 230*a*) and the second end (vias 230*b*1 and/or 230*b*2) of the resistor structure 200 is increased.

The resistor structure 200 allows for more resistance tuning control. Because electromigration is restricted to the section 250*a* of the resistor structure 200, the resistance of the resistor structure 200 cannot exceed a maximum value regardless of tuning duration.

Figure 3A:
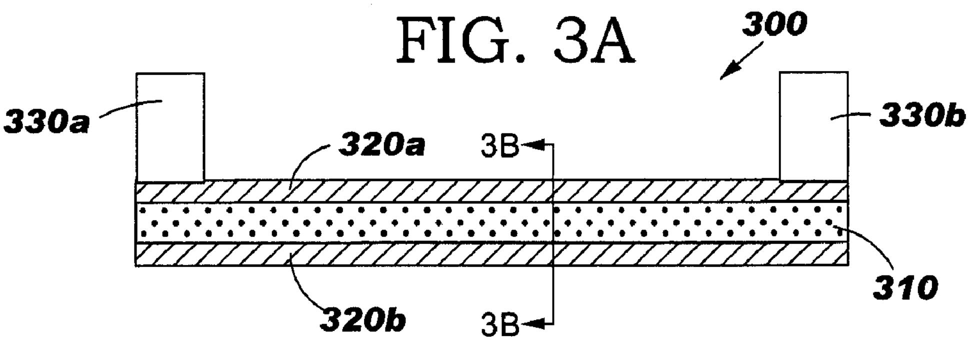
FIG. 3A illustrates a cross-sectional view of yet another resistor structure, in accordance with embodiments of the present invention.

FIG. 3A illustrates a cross-sectional view of a resistor structure 300, in accordance with embodiments of the present invention. Illustratively, the resistor structure 300 comprises a copper plate 310 sandwiched between two plates 320*a* and 320*b* made of TaN (tantalum nitride), which is a material less electrically conducting than copper. In general, the two plates 320*a* and 320*b* can comprise any material less electrically conducting than copper such as TiN, NiCr and SiCr. The two ends of the plate 320*a* are in direct physical contact with the two vias 330*a* and 330*b*.

Figure 3B:
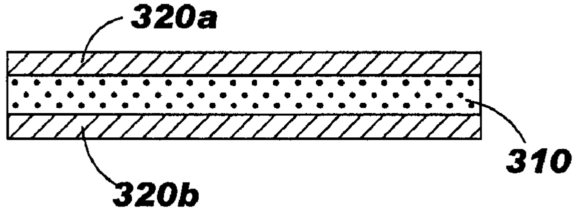
FIG. 3B illustrates a view along a line 3B—3B of the resistor structure of FIG. 3A.

FIG. 3B illustrates a view along the line 3B—3B of the resistor structure 300 of FIG. 3A. As shown in FIG. 3B, the copper plate 310 is sandwiched between the two TaN plates 320*a* and 320*b*.

Figure 3C:
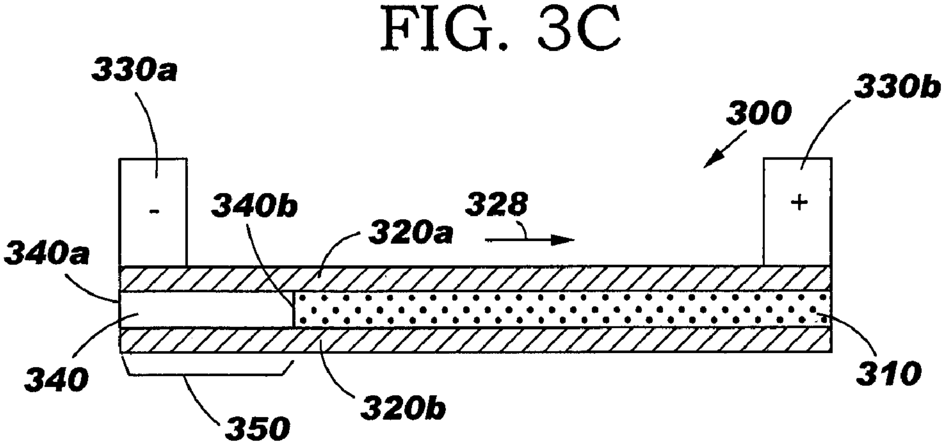
FIG. 3C illustrates the resistor structure of FIG. 3A after tuning, in accordance with embodiments of the present invention.

FIG. 3C illustrates the resistor structure 300 of FIG. 3A after tuning, in accordance with embodiments of the present invention. In one embodiment, a voltage difference is applied between the vias 330*a* and 330*b* with the via 330*b* having a higher voltage than the via 330*a*. As a result, a current flow through the resistor structure 300 from the via 330*b* to the via 330*a*. In essence, the current comprises electrons flowing from the via 330*a* to the via 330*b*. The magnitude of the current is calculated such that electromigration occurs in the copper plate 310, but not in the two TaN plates 320*a* and 320*b*. As a result, a void region 340 forms and grows in the copper plate 310, from the end surface 340*a* of the copper plate 310, and in the direction of the flow of electrons (i.e., the direction 328). Because the resistor structure 300 loses a good conducting portion to the void region 340, the resistance of the resistor structure 300 between the vias 330*a* and 330*b* is increased. In this structure 300, the resistance increase when the void region 340 extends completely across the wire 310 would be 100–1000%, and, as a result of this substantial resistance increase rate, the time required to tune the resistance during electromigration stressing would be reduced.

Figure 4A:
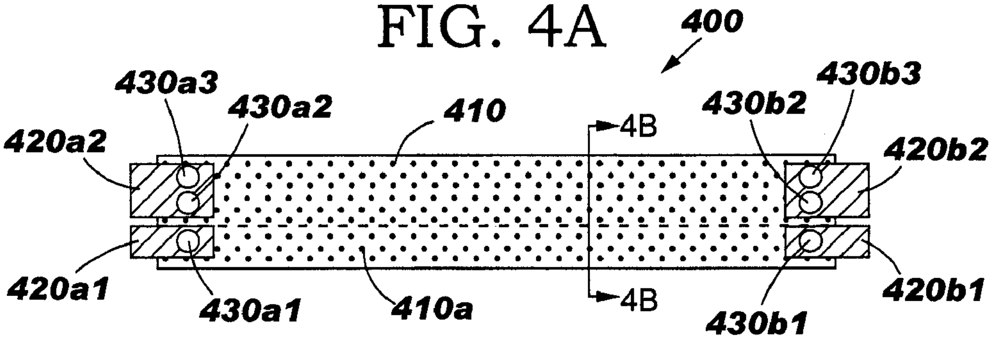
FIG. 4A illustrates a top view of yet another resistor structure, in accordance with embodiments of the present invention.

FIG. 4A illustrates a top view of a resistor structure 400, in accordance with embodiments of the present invention. Illustratively, the resistor structure 400 comprises a silicide layer 410 formed on a Si layer 440 (FIG. 4B) or any type of materials that will react to form a metallic composite layer. A first end of the silicide layer 410 is electrically coupled to interconnect region 420*a*1 through the via 430*a*1 and to interconnect region 420*a*2 via the vias 430*a*2 and 430*a*3. A second end of the silicide layer 410 is electrically coupled to interconnect region 420*b*1 through the via 430*b*1 and to interconnect region 420*b*2 through the vias 430*b*2 and 430*b*3.

Figure 4B:
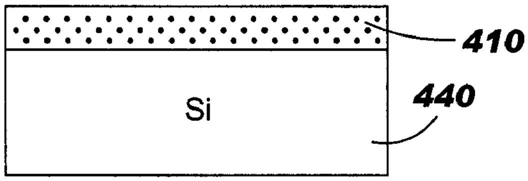
FIG. 4B illustrates a view along a line 4B—4B of the resistor structure of FIG. 4A.

FIG. 4B illustrates a view along a line 4B—4B of the resistor structure 400 of FIG. 4A. Shown from top down are the silicide layer 420 and the Si layer 440.

Figure 4C:
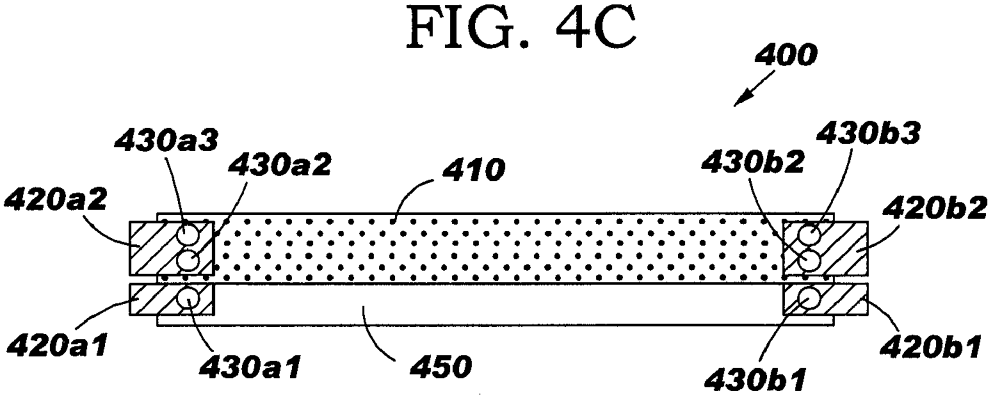
FIG. 4C illustrates the resistor structure of FIG. 4A after tuning, in accordance with embodiments of the present invention.

FIG. 4C illustrates the resistor structure 400 of FIG. 4A after tuning, in accordance with embodiments of the present invention. In one embodiment, a voltage difference is applied between the vias 430*a*1 and 430*b*1 (through the interconnect regions 420*a*1 and 420*b*1, respectively) with the via 430*b*1 having a higher voltage than the via 430*a*1. The voltage difference is such that electromigration occurs in the silicide plate 410. Optimizing the design in order to induce current crowding, current densities in the silicide plate 410 are larger at points closer to an imaginary straight line connecting the vias 430*a*1 and 430*b*1. As a result, it is feasible to cause electromigration to occur only in a portion 410*a* of the silicide plate 410 near the imaginary straight line connecting the vias 430*a*1 and 430*b*1. In one embodiment, electromigration in the portion 410*a* is maintained for a period of time long enough so that the silicide material in the portion 410*a* of the silicide plate 410 disappears and what is left is a nonsilicide Si region 450. Because the resistor structure 400 loses the good conducting material (silicide) in the portion 410*a*, the resistance of the resistor structure 400 between the interconnect regions 420*a*2 and 420*b*2 is increased.

FIG. 5A1 illustrates a cross-sectional view of a resistor structure 500, in accordance with embodiments of the present invention. Illustratively, the resistor structure 500 comprises a silicide layer 510 formed on silicon region 520. The resistor structure 500 further comprises, illustratively, vias 530.1, 530.2, 530.3, 530.4, 530.5, 530.6, and 530.7 being spread along and in electrical contact with the silicide layer 510. In one embodiment, the vias 530.1, 530.2, 530.3, 530.4, 530.5, 530.6, and 530.7 are evenly spread along the silicide layer 510.

FIG. 5A2 illustrates the resistor structure 500 of FIG. 5A1 after tuning, in accordance with embodiments of the present invention. In one embodiment, a voltage difference is applied between the vias 530.2 and 530.4 with the via 530.4 having a higher voltage than the via 530.2. As a result, a current flows through the silicide layer 510 from the via 530.4 to the via 530.2. In essence, the current comprises electrons flowing in the silicide layer 510 from the via 530.2 to the via 530.4. The voltage difference and the sizes and shapes of the suicide layer 510 are such that electromigration occurs only in the silicide layer 510. As a result of electromigration occurring in the silicide layer 510, a nonsilicide Si region 540 with no silicide forms and grows in the silicide layer 510 from a point 540*a* under the via 530.2, and in the direction of the flow of the electrons constituting the current (i.e., the direction 528). In one embodiment, the tuning time is long enough such that the nonsilicide Si region 540 extends to a point 540*b* under the via 530.4. Because the resistor structure 500 loses a good conducting portion to the nonsilicide Si region 540, the resistance of the resistor structure 500 between the vias 530.1 and 530.7 is increased.

In the embodiment described above, two intervals of the silicide layer 510 are replaced by the nonsilicide Si region 540. The first interval is between the via 530.2 and via 530.3. The second interval is between the via 530.3 and via 530.4. In an alternative embodiment, the tuning of the resistor structure 500 described above can be performed in two steps. The first step involves applying a voltage difference between the vias 530.2 and 530.3 with the via 530.3 having a higher voltage than the via 530.2 so as to expand the nonsilicide Si region 540 throughout the first interval of the suicide layer 510. The second step involves applying a voltage difference between the vias 530.3 and 530.4 with the via 530.4 having a higher voltage than the via 530.3 so as to expand the nonsilicide Si region 540 throughout the second interval of the silicide layer 510.

In general, given a pre-specified target resistance value for the resistor structure 500 (FIG. 5A1) between the vias 530.1 and 530.7, it can be calculated how many intervals of the silicide layer 510 should be replaced by the nonsilicide Si region 540 so that the resulting resistor structure 500 has a resistance value within a pre-determined tolerance of the pre-specified target resistance value. For example, suppose that after calculation, three intervals of the silicide layer 510 should be replaced by the nonsilicide Si region 540. As a result, a voltage difference can be applied between the via 530.2 and the via 530.5 of the resistor structure 500 (FIG.

5A1). The magnitude and duration of the applied voltage difference are such that the nonsilicide Si region 540 expands in the silicide layer 510 all the way from the via 530.2 to the via 530.5.

FIGS. 5B1 and 5B2 illustrate cross-sectional views of yet another resistor structure 550 before and after tuning, respectively, in accordance with embodiments of the present invention. With reference to FIG. 5B1, the resistor structure 550 comprises illustratively a Si region 560, a dielectric layer 590 formed on the Si region 560, a silicide layer 570 which comprises two separate sections 570*a* and 570*b*. The dielectric layer 590 is used as a mask in the formation of the silicide layer sections 570*a* and 570*b*. The resistor structure 550 further comprises vias 580.1, 580.2, 580.3, and 580.4 electrically coupled to the silicide layer 570.

FIG. 5B2 illustrates the resistor structure 550 after tuning. More specifically, tuning can be performed by applying a voltage difference to the vias 580.2 and 580.3 with the via 580.2 being at a lower voltage than the via 530.3 such that electromigration occurs in the silicide layer section 570*b*. As a result, the non-silicide Si region 595 extends to the right (i.e., direction 597) in the direction of the flow of the electrons. Because the resistor structure 550 loses a good conducting region to the non-silicide Si region 595, the resistance of the resistor structure 550 between the vias 580.1 and 580.4 is increased.

The resistance of the resistor structure 550 between the vias 580.1 and 580.4 before tuning (FIG. 5B1) is determined essentially by the resistive Si region 598 beneath the dielectric layer 590. After tuning, this resistive Si region 598 extends further in the direction 597 to the via 580.3 (i.e., to include the non-silicide Si region 595). As a result, the length of the non-silicide Si region 595 compared with the length of the Si region beneath the dielectric layer 590 determines the resistance increase percentage of the resistor structure 550. For example, if the nonsilicide Si region 595 is half the length of the dielectric layer 590, the resistance increase percentage of the resistor structure 550 is 50%. As a result of this gradual resistance increase rate, this structure resistor 550 would allow one to implement very fine tuning of the resistance required for the most precise circuit requirements.

On the contrary, the resistance of the resistor structure 500 (FIG. 5A1) between the vias 530.1 and 530.7 before tuning is determined essentially by the silicide layer 510 which has a relatively low resistance (because silicide is a good conducting material). However, the resistance of the resistor structure 500 between the vias 530.1 and 530.7 after tuning (FIG. 5A2) is determined essentially by the non-silicide Si region 540 which has a relatively high resistance (because Si is not a good conducting material compared with silicide). Therefore, the resistance increase is substantial. As a result of this substantial resistance increase rate, this structure 500 would allow one to reduce tuning time, which is important in the case where a large number of resistors are to be tuned.

Figure 6:
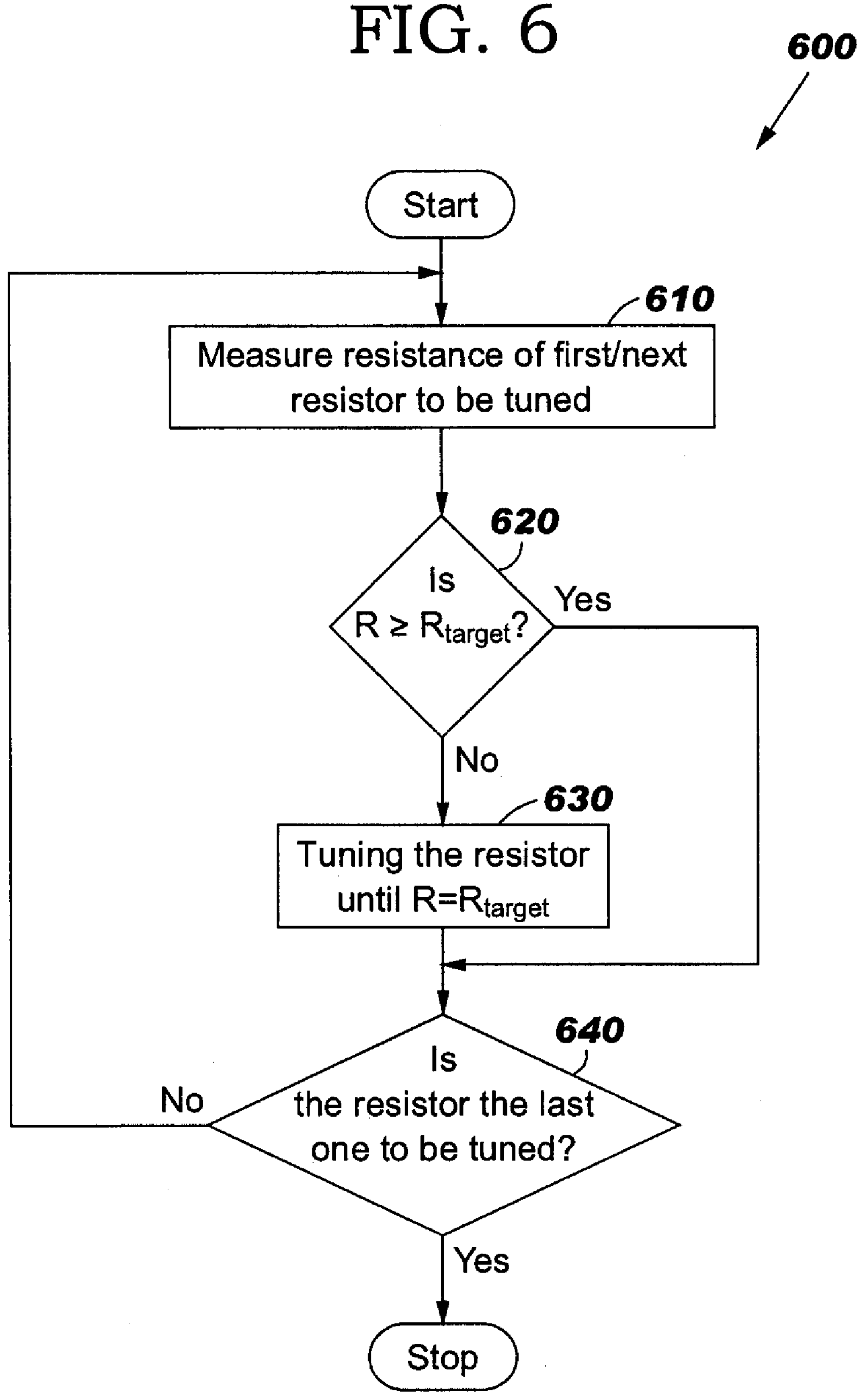
FIG. 6 illustrates a flow chart of a method for tuning resistors, in accordance with embodiments of the present invention.

FIG. 6 illustrates a flow chart of a method 600 for tuning multiple resistors, one at a time, in accordance with embodiments of the present invention. The multiple resistors to be tuned can be similar to the resistor structures 100, 200, 300, 400, and 500 (FIGS. 1A, 2A, 3A, 4A, and 5A, respectively). For illustration, assume that multiple resistors 100 are to be tuned using the method 600. The method 600 starts at step 610 in which the resistance of a first (or next) resistor 100 is measured. In one embodiment, the resistor's resistance can be measured by applying a voltage difference across the resistor 100 and measuring the resulting current flowing through the resistor 100. Then, in step 620, a determination is made as to whether the measured resistance at least equals a pre-specified target resistance value. If no, in step 630, the resistor is tuned (i.e., its resistance is increased) until its resistance at least equals the target resistance value. More specifically, in one embodiment, a voltage difference can be applied across the resistor 100 between the vias 130*a* and 130*b*. The voltage difference is such that electromigration occurs only in the copper wire 110, but not in the liner layer 120. At the same time, the resulting current is measured. As a result, the resistance of the resistor 100 can be computed at any time (i.e., resistance monitoring). When the resistance of the resistor 100 exceeds the pre-specified target resistance value, the applied voltage difference is removed from the resistor 100. In an alternative embodiment, the applied voltage difference is removed from the resistor 100 as soon as the resistance of the resistor 100 between the vias 130*a* and 130*b* is within a predetermined tolerance of the pre-specified target resistance value. After step 630, the method 600 goes to step 640.

If the answer to the question in step 620 is affirmative, the method 600 skips to step 640. In step 640, a determination is made as to whether the resistor 100 is the last one to be tuned. If yes, the method 600 stops. If the answer to the question in step 640 is negative, the method 600 loops back to step 610 where the resistance of the next resistor 100 to be tuned is measured.

In summary, a resistor structure according to embodiments of the present invention comprises an electrically conducting region coupled to a liner region. Both the electrically conducting region and the liner region are electrically coupled to first and second contact regions. A voltage difference is applied between the first and second contact regions. As a result, a current flows between the first and second contact regions in the electrically conducting region. The voltage difference and the materials of the electrically conducting region and the liner region are such that electromigration occurs only in the electrically conducting (very low resistive) region. As a result, a void region expands in the electrically conducting region in the direction of the flow of the charged particles constituting the current. Because the resistor structure loses a conducting portion of the electrically conducting region to the void region, the resistance of the resistor structure is increased (i.e., tuned). In general, the void region is not necessarily vacuum. Here, the void region comprises what is left after some electrically conducting materials of the electrically conducting region has migrated away due to electromigration. For instance, the nonsilicide Si region 540 (FIG. 5A2) can be called a void region, comprising what is left after silicide has migrated away.

In the embodiments described above, copper and suicide materials are used. In general, any material in which electromigration occurs in response to sufficiently strong current can be used.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A resistor structure, comprising:

an electrically conductive region;

an electrically conductive liner region in direct physical contact with the electrically conductive region; and first and second contact regions electrically coupled to the electrically conductive region and the electrically conductive liner region, wherein the first contact region is in direct physical contact with the electrically conductive liner region, wherein in response to a current flowing in the electrically conductive region and from the first contact region to the second contact region, a void region in the electrically conductive region expands due to electromigration so as to increase the resistance of the resistor structure between the first and second contact regions, wherein the electrically conductive region is surrounded by the electrically conductive liner region, and wherein both the electrically conductive region and the electrically conductive liner region are in direct physical contact with the second contact region.

2. The resistor structure of claim 1, wherein the first contact region is not in direct physical contact with the electrically conductive region.

* * * * *